(12) United States Patent
Goto et al.

(10) Patent No.: US 7,126,093 B2
(45) Date of Patent: Oct. 24, 2006

(54) HEATING SYSTEMS

(75) Inventors: Yoshinobu Goto, Nagoya (JP); Hideyoshi Tsuruta, Tokai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/064,406

(22) Filed: Feb. 23, 2005

(65) Prior Publication Data

US 2006/0186109 A1 Aug. 24, 2006

(51) Int. Cl.
*H05B 3/68* (2006.01)
*C23C 16/00* (2006.01)

(52) U.S. Cl. .................... 219/444.1; 118/724

(58) Field of Classification Search ............. 219/443.1, 219/444.1, 465.1, 466.1, 467.1, 544, 546, 219/547; 118/724, 725
See application file for complete search history.

(56) References Cited

U.S. PATENT DOCUMENTS 6,261,708 B1    7/2001   Ohashi et al.
6,507,006 B1 *  1/2003   Hiramatsu et al. ........ 219/444.1
6,753,507 B1 *  6/2004   Fure et al. ................ 219/444.1
6,835,916 B1 * 12/2004   Ito et al. .................. 219/444.1
2003/0089699 A1* 5/2003  Hiramatsu et al. ........ 219/444.1

FOREIGN PATENT DOCUMENTS

JP    05-326112    12/1993

OTHER PUBLICATIONS

U.S. Appl. No. 10/884,294, filed Jul. 2, 2004, Yamaguchi et al.

* cited by examiner

*Primary Examiner*—Sang Paik
(74) *Attorney, Agent, or Firm*—Burr & Brown

(57) ABSTRACT

An object of the present invention is to provide a heating system having a ceramic heater and a supporting member supporting the back face of the heater, so that the cost of the supporting member can be reduced, the design change of the heater is made easier and excellent flatness of the heating face on use can be maintained. The heating system has a ceramic substrate 1 having a heating face 1a and a back face 1b, a heating means 4 for generating heat from the heating face 1a of the substrate 1, a metal supporting member 6 supporting the back face 1b of the substrate 1, and a heat insulating plate 5 provided between the back face 1b of the substrate 1 and the supporting member 6.

15 Claims, 5 Drawing Sheets

HEATING SYSTEMS

BACKGROUND OF THE INVENTION

1. Field of the Invention

The invention relates to a heating system.

2. Related Art Statement

In a system for producing semiconductors, a ceramic heater has been provided for heating a wafer so as to deposit a semiconductor thin film on the wafer from gaseous raw materials such as silane gas by means of thermal CVD or the like. Such a ceramic heater is known as a two-zone heater. Such two-zone heater has a ceramic substrate and inner and outer resistance heat generators made of a metal of a high melting point embedded in the substrate. Separate power supply terminals are connected to the respective heat generators so that electric power is applied independently to the respective generators. The inner and outer heat generators can be thus independently controlled.

According to JP-A 5-326112, a resistance heat generator of a ceramic heater is constituted by plural circuit patterns each made of a high molting point metal. The circuit patterns are so arranged that they may supplement one another's defect portions. It is provided that one of the patterns has a defect portion such as a folded portion or a returning portion. In this case, another circuit pattern is overlapped on or over the defect portion of the one pattern.

For example, in a heater to be used for heating semiconductor wafers, the temperature of the heating face of the heater needs to be uniformly controlled over the entire surface. It is required that the heater satisfies strict specifications, for example, that the temperature measured on the heating face must be held within ±10° C. of the average across the whole heating face under a use condition. A ceramic heater is excellent on the viewpoint of uniformity of temperature on the heating face. Further, for example, when a semiconductor wafer is held and heated, it is possible to reduce thermal deformation of the surface contacting a wafer over time and to preserve the flatness of a wafer.

Such ceramic heater is needed to be fixed onto an inner wall surface of a chamber. One end of a tubular substrate made of a ceramic plate is fixed to a joining face of a ceramic heater and the other end of the supporting member is fixed to an inner wall surface of a chamber. The supporting member is formed of a heat resistant ceramic plate made of alumina, aluminum nitride or the like. The supporting member and chamber are sealed with each other in an air-tight manner with an o-ring. The inner space of the supporting member and the inner space of the chamber are sealed in an air-tight manner to prevent the leakage of a gas in the inner space of the chamber to the outside of the chamber.

SUMMARY OF THE INVENTION

The tubular supporting member made of heat resistant and dense ceramics has a high manufacturing cost, and the joining and fixing of the supporting member to a ceramic heater is difficult. The cost for the joining the parts is also high. Once the supporting member composed of a ceramic tube is joined with the ceramic heater, the ceramic tube and ceramic heater are strongly joined with each other. It is thus impossible to remove the supporting member from the heater and to reuse the supporting member once joined. Further, when the design of the ceramic supporting member is changed, simulation of the effects of the design change on the temperature distribution on the heating face is difficult, so that the design change requires a substantial time and troublesome work.

The inventors have tried to produce a tubular supporting member made of a corrosion resistant metal and fix it to a ceramic heater. They also studied the appropriate design for providing uniform temperature distribution on the heating face. The manufacturing cost of tubular supporting member is low, and the joining can be easily carried out with a mechanical method. Further, it is possible to remove the supporting member from the ceramic heater and reuse it allowing for relatively easy design changes.

When a ceramic heater is fixed to the tubular supporting member made of a metal and the temperature on the heating face of the heater is raised to about 450° C., the flatness of the heating face may be deteriorated. When the flatness of the heating face is deteriorated, the flatness of a semiconductor wafer mounted on the heating face is deteriorated, so that there is a risk that the ceramic heater will need to be replaced.

An object of the present invention is to provide a heating system having a ceramic heater and a supporting member supporting the back face of the heater, so that (1) the cost of the supporting member can be reduced, (2) the design change of the system can be made easier, and (3) excellent flatness of the heating face enduring use can be maintained.

The present invention provides a heating system comprising a ceramic substrate having a heating face and a back face, a heating means for generating heat from the heating face of the substrate, a metal supporting member supporting the back face of the substrate, and a heat insulating plate provided between the back face of the substrate and the supporting member.

The inventors have studied the cause of deterioration of the flatness of the heating face when a ceramic heater is supported with a metal supporting member and the temperature of the heating face of the heater is raised. It is finally found that the part of the supporting member contacting the heater is unevenly deformed due to creep caused by thermal contact conduction from the heater to the supporting member. If the part of the supporting member contacting the heater is unevenly deformed due to creep, the heating face may be inclined to the wafer. It thus becomes impossible to fix the wafer at a predetermined position on the heating face so that semiconductor process cannot be carried out.

Based on the above discovery, the inventors have tried to provide a heat insulating plate between the back face of the heater and the supporting member. It has successfully prevented a temperature increase on the part of the supporting member contacting the heat insulating plate, and it has prevented the deformation due to creep of the supporting member, so that the deterioration of the flatness and inclination of the heating face of the heater can be prevented.

DETAILED DESCRIPTION OF THE INVENTION

The present invention will be described below further in detail referring to the attached drawings.

Figure 1:
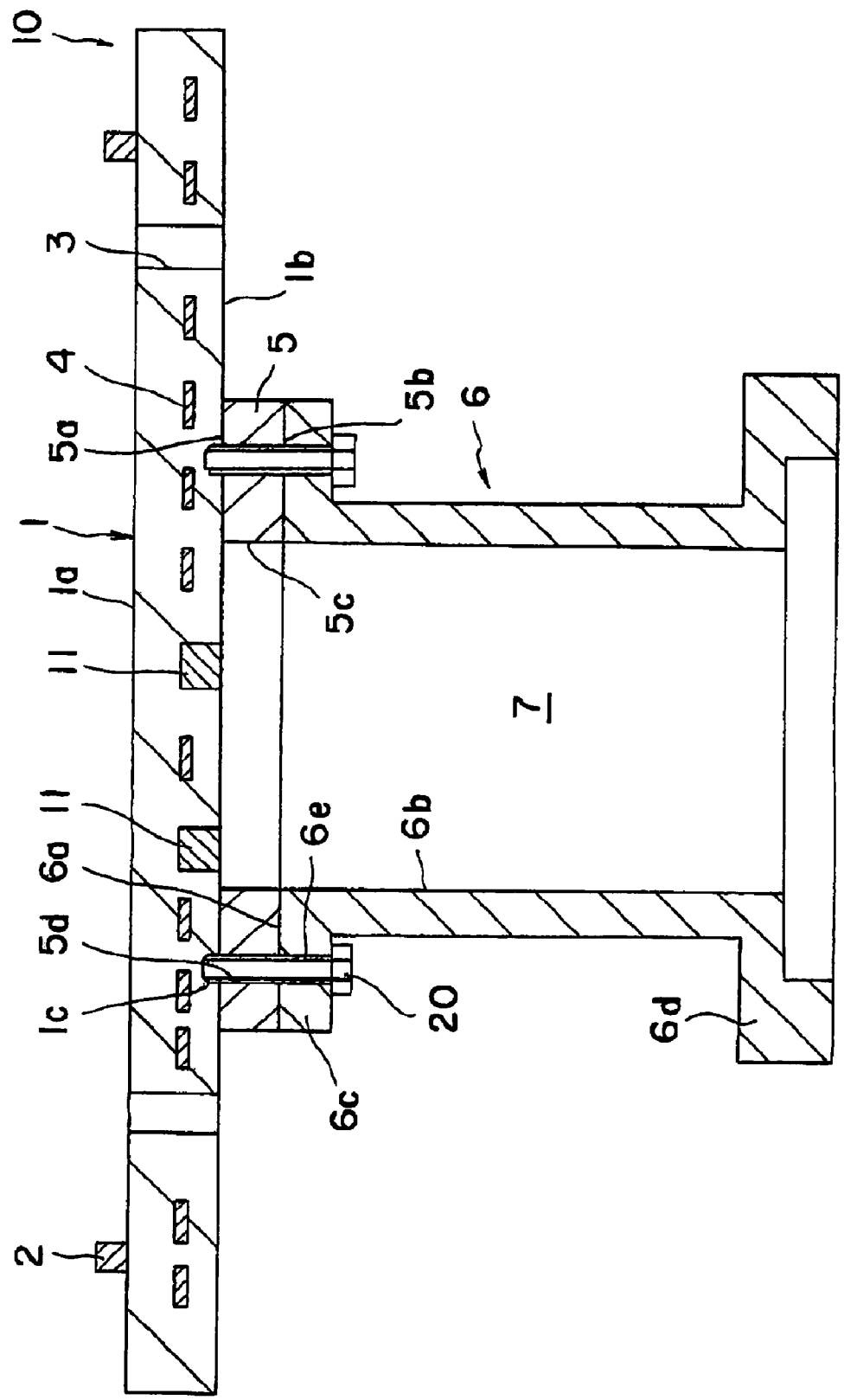
FIG. 1 is a cross sectional view schematically showing a heating system according to an embodiment of the present invention.
Figure 2:
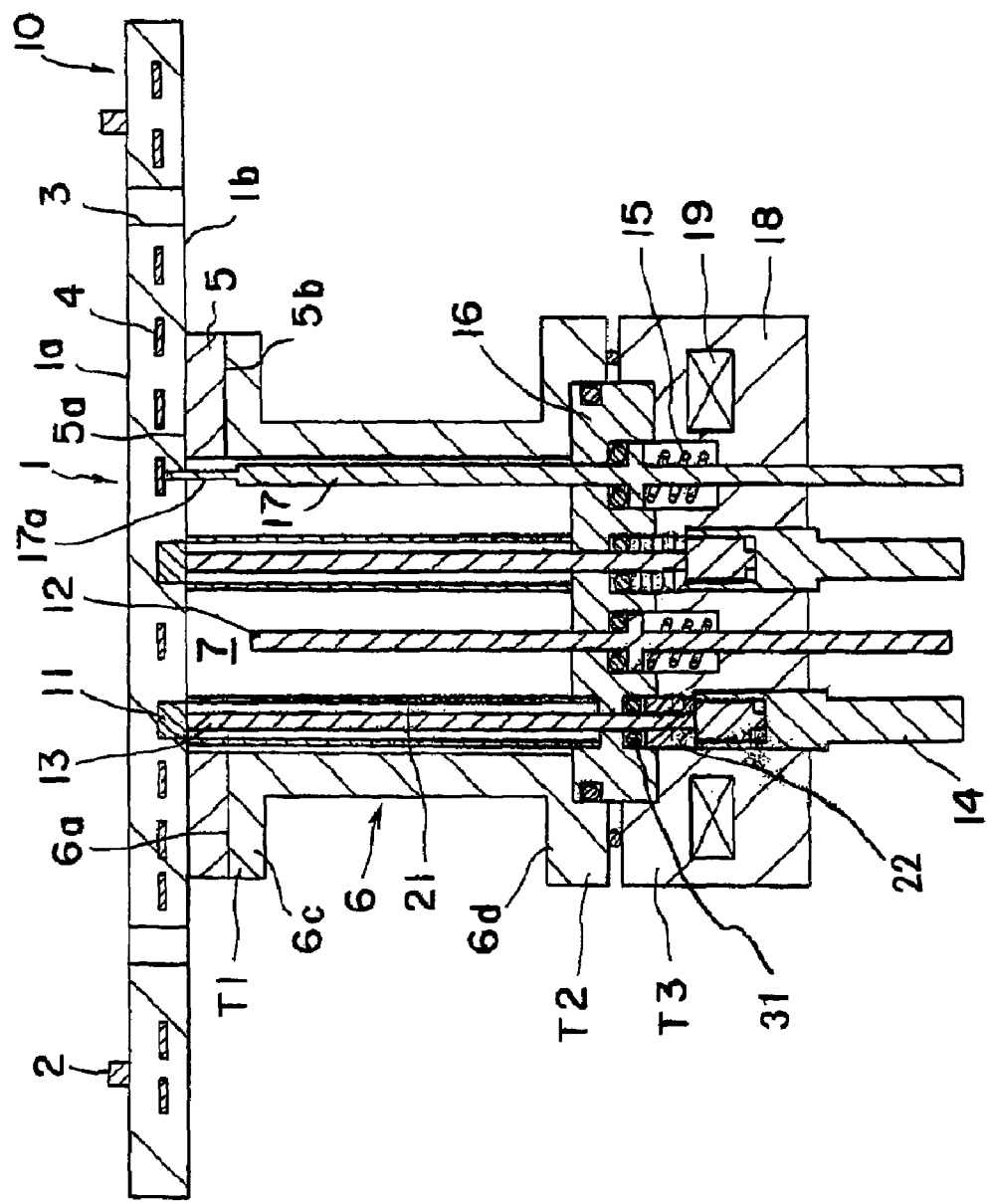
FIG. 2 is a cross sectional view schematically showing a heating system of FIG. 1 fixed to a cooling shaft 18.

According to a preferred embodiment, the heating means is a heating resistance embedded in a ceramic substrate. FIG. 1 is a cross sectional view schematically showing a heating system according to this embodiment, and FIG. 2 is a cross sectional view showing the heating system of FIG. 1 fixed to a cooling shaft 18.

A heating resistance 4 is embedded in the ceramic substrate 1 of a ceramic heater 10 according to the present example. Pins 2 for mounting a wafer is formed on the heating face 1a of the ceramic substrate 1. Terminals 11 of the heating resistance is exposed to the back face 1b of the substrate 1. The surface 5a of a ring-shaped heat insulating plate 5 contacts and is fixed onto the back face 1b. Further, the upper face 6a of a flange portion 6c of a substantially tubular shaped supporting member 6 contacts and is fixed onto the opposite surface 5b of the heat insulating plates. A flange portion 6d of the supporting member 6 is provided on the opposite side to the flange portion 6c and can be fixed onto a cooling shaft 18 shown in FIG. 2. The cooling shaft 18 is designed so that the shaft can be fixed to a chamber not shown.

An inner wall surface 5c of the ring shaped heat insulating plate 5 is formed to be continuous with the inner wall surface 6b of the supporting member 6 substantially without forming a step therebetween. The heat insulating plate 5 and supporting member 6 together form a space 7 separated from the atmosphere in the chamber.

Methods of joining the supporting member 6 and heat insulating plate 5 and of joining the plate 5 and ceramic substrate 1 are not limited and include solid phase welding, solid-liquid-phase welding, soldering and mechanical fixing such as screwing, shrinkage fit, press fit, friction welding and welding. The solid-liquid phase welding is described in a U.S. Pat. No. 6,261,708 (Japanese patent publication 273,370A/1998). More preferably, as shown in FIG. 1, the supporting member 6 and heat insulating plate 5 or the plate 5 and ceramic substrate 1 may be fastened with a fastener such as a screw, bolt or the like. That is, a screw hole 6e is formed in the flange portion 6c, a through hole 5d is formed in the heat insulating plate 5, and a screw hole 1c is formed in the ceramic substrate 1. A screw 20 is fitted into the screw holes and through hole to fasten the substrate 1, heat insulating plate 5 and supporting member 6 as an integral body.

According to the present example, if a torque of thread fastening with a screw 20 is too large, there would be a risk of crack formation in the substrate 1 upon heating due to a difference of thermal expansion between the substrate 1 and heat insulating plate 5. On the viewpoint, the torque of thread fastening may preferably be 10 Nm or lower. If the torque of thread fastening is too small, it is difficult to maintain a high degree of vacuum. On the viewpoint, the torque of thread fastening may preferably be 0.05 Nm or larger.

FIG. 2 is a cross sectional view showing the heating system of FIG. 1 fixed to the cooling shaft 18. A ceramic protective cylinder 21 is further contained inside of the supporting member 6, and a rod shaped member 13 for power supply is contained in the protective cylinder 21. One end of the power supply member 13 is connected to a terminal 11, and the other end is connected to a connector 14 fixed to the cooling shaft 18. Electric power can be supplied from the connector 14 to the heating resistance 4 through the power supply member 13 and terminal 11. The power supply member 13 is insulated from the cooling shaft 18 by an insulator 22.

A tube 12 for purging inert gas is inserted into the space 7 and energized by a spring 15 in a direction from the cooling shaft 18 to the substrate 1. Further, a rod 17 for holding thermocouple is inserted into the space 7 and a thermocouple 17a held at the tip end is fixed to the substrate 1. An insulating plate 16 is inserted between the cooling shaft 18 and the flange portion 6d of the tubular supporting member 6. The cooling shaft 18 and supporting member 6, the supporting member 6 and insulating plate 16, insulating plate 16 and power supply member 13, and tube 12 for purging and rod 17 for holding thermocouple are sealed with O-rings, respectively. A cooling flange 19 is provided in the cooling shaft 18, and cooling medium is circulated in the cooling flange 19. The insulating plate 16 and insulator 22 are sealed with a sealing member 31.

The material of the ceramic substrate 1 is selected depending on applications and is not particularly limited. The material may preferably be a ceramics having anti-corrosion properties against a halogen based corrosive gas, may more preferably be aluminum nitride, dense alumina, silicon carbide or silicon nitride, and most preferably be aluminum nitride ceramics or alumina having a relative density of 95 percent or more. Aluminum nitride having a high thermal conductivity is most preferred. A functional member such as a heating resistance, an electrode for electrostatic chuck and an electrode for generating high frequency may be embedded in the ceramic substrate.

Although the material of the supporting member for the substrate 1 is not particularly limited as far as the material is a metal, the material may preferably be a heat resistant metal or a metal having a low thermal conduction. On the viewpoints, SUS and a heat resistant nickel alloy such as Inconel arc preferred. According to the present invention, an aluminum alloy having a high purity can be used, even if the temperature on the heating face is 400° C. or higher. Among such aluminum alloys, corrosion resistant aluminum extension material A6061 is listed.

When the heating resistance is embedded in the ceramic substrate, the material of the heating resistance may preferably be a pure metal selected from the group consisting of tantalum, tungsten, molybdenum, platinum, rhenium and hafnium, or an alloy of two or more metals selected from the group consisting of tantalum, tungsten, molybdenum, platinum, rhenium and hafnium. When the substrate is formed of aluminum nitride, the material of the heating resistance may be metal molybdenum or the alloy of molybdenum. The shape of the heating resistance may be coil film, printed paste (sintered metal), mesh, plate shaped body, ribbon shaped body or sheet shaped body. It is preferred that the heating resistance is not coil-shaped for reducing the thickness of the ceramic substrate.

The heating resistance in the ceramic substrate and terminal 11 may be joined with a method not particularly limited, including caulking, soldering and screwing.

The material of the heat insulating plate 5 is not particularly limited, and may preferably be alumina or quartz having a low thermal conduction and corrosion resistant property. Further, the thickness of the heat insulating plate 5 may preferably be 1 mm or larger and more preferably be 3 mm or larger on the viewpoint of heat insulation. On the other hand, if the heat insulating plate 6 is too large, cracks tend to be formed easier due to a difference of thermal expansion between the plate 5 and substrate 1. The thickness of the heat insulating plate 5 may preferably be 20 mm or smaller on the viewpoint.

The applications of the heating system according to the present invention is not particularly limited, and include a chemical vapor deposition system, etching system, baking system and curing system for a coater.

Figure 3:
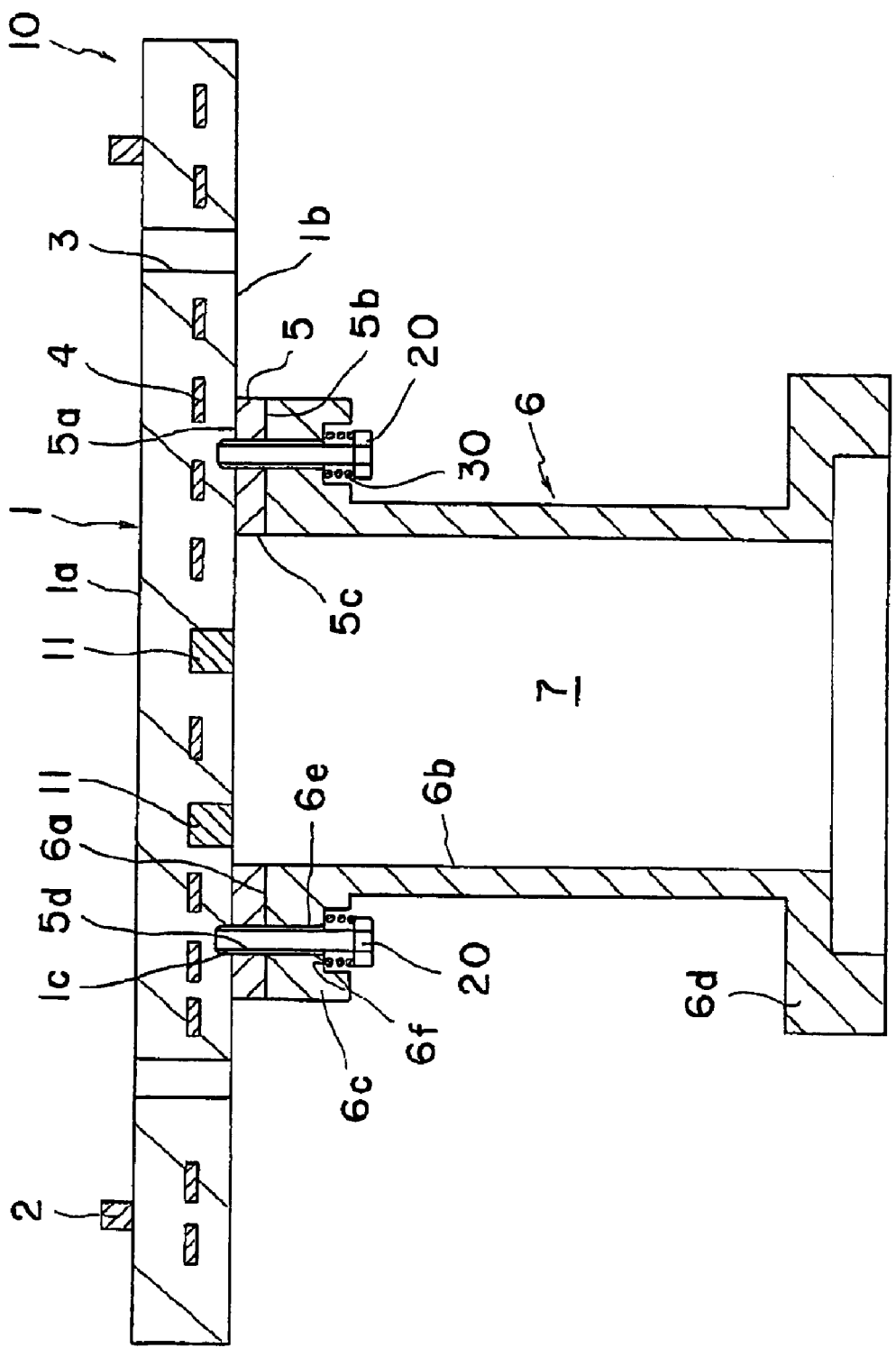
FIG. 3 is a cross sectional view schematically showing a heating system according to another embodiment of the present invention.
Figure 4:
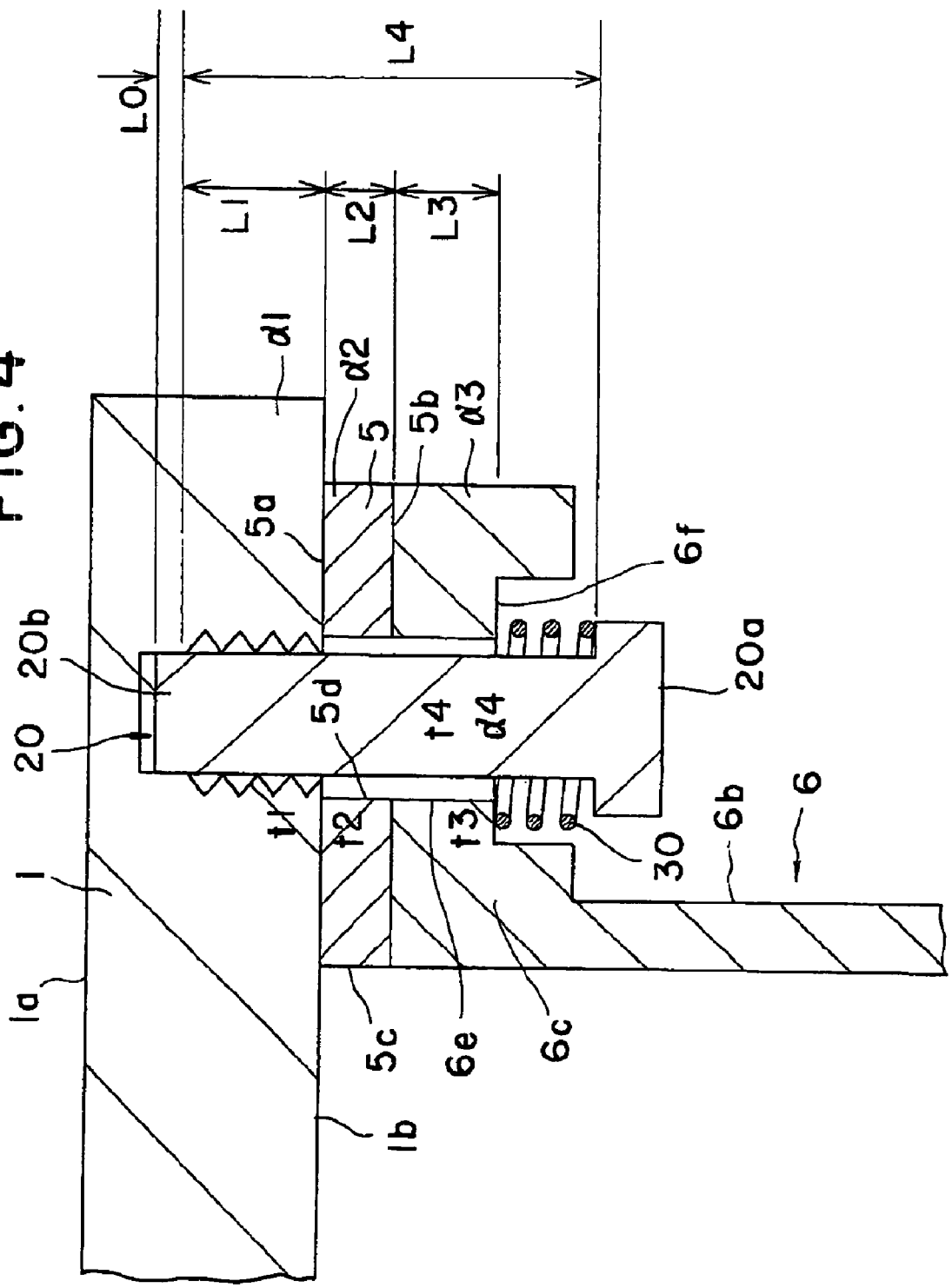
FIG. 4 is a cross sectional view schematically showing an enlarged view of the system of FIG. 3 near the fastener 20.
Figure 5:
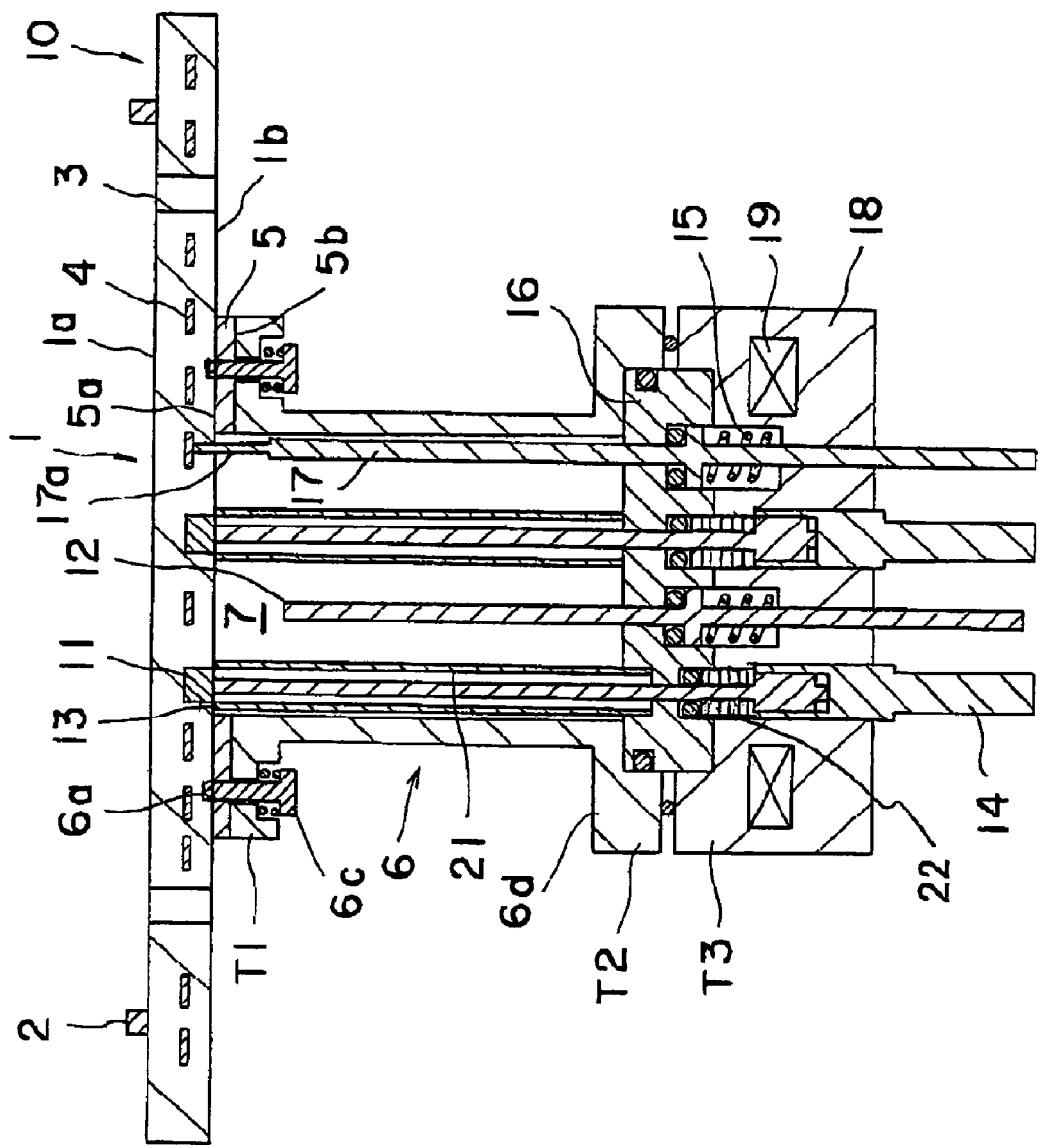
FIG. 5 is a cross sectional view showing the heating system of FIG. 3 fixed to a cooling shaft 18.

FIGS. 3, 4 and 5 relate to another embodiment of the present invention. FIG. 3 is a cross sectional view schematically showing a heating system according to this embodiment, FIG. 4 is a cross sectional view schematically showing an enlarged view of the system of FIG. 3 near a fastener 20, and FIG. 5 is a cross sectional view showing the heating system of FIG. 3 fixed to a cooling shaft 18. The parts already shown in FIGS. 1 and 2 are specified using the same numerals already shown in FIGS. 1 and 2 and the explanation may be omitted.

The surface 5a of a ring-shaped heat insulating plate 5 contacts and is fixed onto the back face 1b. The upper face 6a of a flange portion 6c of a substantially tubular shaped supporting member 6 contacts and is fixed onto the opposite surface 5b of the heat insulating plate. A flange portion 6d of the supporting member 6 is provided on the opposite side to the flange portion 6c and is fixed onto the cooling shaft 18 as shown in FIG. 5. The cooling shaft 18 is designed so that the shaft can be fixed to a chamber not shown.

An inner wall surface 5c of the ring shaped heat insulating plate 5 is formed to be continuous with the inner wall surface 6b of the supporting member 6 substantially without forming a step therebetween. The heat insulating plate 5 and supporting member 6 together form an inner space 7. The inner space 7 may be sealed against the atmosphere in the chamber containing corrosive gas. For this, it is necessary to seal the plate 5 and substrate 1 and to seal the plate 5 and the flange portion 6c in air tight manner. Alternatively, the inner space 7 may not be sealed against the corrosive gas atmosphere in the chamber. In this case, it is necessary to purge the inner space 7 by inert gas such as nitrogen gas.

The supporting member 6, heat insulating plate 5 and ceramic substrate 1 are fastened with the fastener 20. The through hole 6e is formed in the flange portion 6c, the through hole 5d is formed in the plate 5, and the screw hole 1c is formed in the substrate 1. The fastener 20 such as bolt or screw is fitted into the screw holes and through hole to fasten the substrate 1, plate 5 and supporting member 6 as an integral body.

As shown in FIG. 4, a seat face 6f is formed in the flange portion 6c for setting an elastic body 30 thereon. The fastener 20 has a head 20a and fastening part 20b. The elastic body 30 contacts the head 20a and is pressed by the head towards the substrate 1.

According to a preferred embodiment, the inventive heating system has an elastic body for energizing the fastener. For example, according to the heating system shown in FIGS. 1 and 2, the substrate 1, heat insulating plate 5 and flange portion 6c are fastened by a torque applied by the fastener 20. In this case, if the thermal expansion coefficient of the material of the fastener 20 is too small, a large pressure may be applied on the the screw formed on the inner surface of the screw hole of the ceramic substrate upon heating, so that the chipping or cracks may occur in the ceramic material.

On the viewpoint, it is preferred to select the material of the fastener 20 having a larger thermal expansion coefficient. If the thermal expansion coefficient of the material of the fastener 20 is too large, however, the fastening torque is substantially reduced upon heating, so that the substrate 1, plate 5 and flange portion 6c might be disengaged.

When an elastic body 30 (see FIG. 4) is provided for energizing the fastener 20, it becomes possible to increase the thermal expansion coefficient of the fastener 20 to prevent the chipping and cracks in the ceramic material of the substrate 1. That is, the length "L4" of the fastener 20 subjected to fastening is substantially enlarged upon heating when the thermal expansion coefficient of the fastener is large. In the embodiment, however, the elastic body 30 maintains a pressure onto the head 20a and seat face 6f to prevent the disengagement of the flange portion 6c, plate 5 and substrate 1.

According to a preferred embodiment of the present invention, the ceramic substrate, heat insulating plate, metal supporting member and fastener satisfy the following formula.

$$(L1 \times \alpha1 \times (t1-25)) + (L2 \times \alpha2 \times (t2-25)) + (L3 \times \alpha3 \times (t3-25)) < (L4 \times \alpha4 \times (t4-25))$$

In the formula, "α1" represents the thermal expansion coefficient of the material of the substrate 1 (see FIG. 4), "α2" represents the thermal expansion coefficient of the material of the plate 5, "α3" represents the thermal expansion coefficient of the material of the metal supporting member 6, and "α4" represents the thermal expansion coefficient of the material of the fastener 20. The thermal expansion coefficients for the members are the average values between 25° C. and t1, t2, t3 and t4, respectively.

"t1" represents the temperature at a region of the ceramic substrate 1 near the fastener 20, "t2" represents the temperature at a region of the heat insulating plate 5 near the fastener 20, "t3" represents the temperature at a region of the supporting member 6 near the fastener 20, and "t4" represents the average temperature of the fastener 20.

"L1" represents the length of the fastener 20 inserted in the substrate 1 and "L2" represents the length of the fastener 20 inserted in the plate 5. "L3" represents the length of the fastener 20 inserted in the supporting member 6. The length "L3" does not include the length of the fastener outside of the seat face 6f for the elastic body 30, because the thermal expansion of the supporting member 6 does not influence of the disengagement of the substrate 1, plate 5 and flange portion 6c upon heating. "L4" represents the length of the fastener directly subjected to fastening. A portion (for example the head 20a) for applying a pressure onto the supporting member 6 required for the engagement is excluded, and the length "L0" of a part without a screw which does not contribute to engagement is also excluded from the length "L4" directly subjected to engagement.

Each item of $(L1 \times \alpha1 \times (t1-25)) + (L2 \times \alpha2 \times (t2-25)) + (L3 \times \alpha3 \times (t3-25))$ and $(L4 \times \alpha4 \times (t4-25))$ corresponds with the elongation or dimensional change of each member upon heating. As shown in the formula, it is preferred that the elongation of the fastener 20 is made smaller than the total elongation of the substrate 1, plate 5 and supporting member 6c upon heating for preventing the disengagement of the members.

The amount of shrinkage "s" at room temperature of the elastic body may preferably satisfy the following formula for absorbing the differences of thermal expansions of the above embers.

$$s \geq (L4 \times \alpha4 \times (t4-25)) - \{(L1 \times \alpha1 \times (t1-25)) + (L2 \times \alpha2 \times (t2-25)) + (L3 \times \alpha3 \times (t3-25))\}$$

The elastic member may be a spring such as coil spring, plate-shaped spring or the like. A washer may be provided together with the sprig.

The elastic member may be provided between the head of the fastener and the metal supporting member 6 as shown in FIG. 4, and/or between the metal supporting member 6 and the heat insulating plate 5, and/or between the plate 5 and the substrate 1.

Although the material of the elastic member is not particularly limited, the material may preferably be SUS or a heat resistant nickel alloy such as Inconel.

According to a preferred embodiment, an inner space is formed in the metal supporting member, as shown in FIGS. 1 to 5. Preferably, the inner space 7 is sealed in air tight manner. That is, the supporting member 6 and the insulating plate 16 is sealed in air tight manner, the insulating plate 16 and cooling flange 18 are sealed in air tight manner, and the supporting member 6 and cooling flange 18 are sealed in air tight manner. Further, the power supply means 13, gas purging tube 12 and the rod 17 are sealed with the insulating plate 16 (or the cooling shaft 18). It is thus possible to seal the inner space 7 in air tight manner to preserve the space in a high degree of vacuum. Such air-tight sealing can be realized by using an O-ring, gasket or the like. Alternatively, the inner space 7 is not sealed against the atmosphere in the chamber, as already described.

According to a preferred embodiment, a power supply member is provided in the inner space formed in the metal supporting member, and an insulating means surrounds the power supply member for insulation.

That is, as shown in FIGS. 2 and 5, the power supply means 13 is inserted in the inner space 7. When the space 7 is evacuated, there would be a risk of electric discharge from the power supply means 13 to the metal supporting member 6, thermocouple 17a, gas purging tube 12 or the other metal members. Such electric discharge from the power supply means 13 can be prevented by surrounding the power supply means 13 with an insulating means 21.

There may be a clearance between the power supply means 13 and insulating means 21. Alternatively, the power supply means may be contacted with the surrounding insulating means 21 to form a kind of double tube system. In this case, there is no clearance between the power supply means 13 and insulating means 21. The insulating means may be made of any kinds of insulating materials such as ceramics including alumina and heat resistant resins including polyimide resin and PEEK. The upper part of the insulating means 21 near the substrate 1 may preferably be made of a ceramic such as alumina when the lower part of the insulating means 21 is made of a heat resistant resin, because the upper part may be subjected to a high temperature of 200° C. or higher and should be heat resistant.

EXAMPLES

Example 1

A heating system having a construction shown in FIGS. 1 and 2 was produced. The ceramic substrate 1 was made of an aluminum nitride sintered body, in which a molybdenum coil was embedded as the heat generator. Pins 2 for mounting wafer were formed of alumina. The thickness of the substrate 1 was 10 mm and the diameter φ was 320 mm. The heat insulating plate 5 was made of alumina, the thickness of the heat insulating plate 5 was 8 mm and the diameter φ was 80 mm. The tubular supporting member 6 was formed of aluminum alloy, the insulating tube 21 was formed of alumina, and the rod 13 for power supply was formed of nickel. The cooling shaft 18 was formed of aluminum alloy. Nitrogen gas was flown from the tip end of the purging tube 12, while the cooling flange 19 was cooled with flowing water. The heat insulating plate 5, flange portion 6c, and substrate 1 were fastened with a screw 20 made of Inconel.

Using the thus produced heating system, the pressure in the chamber was adjusted at 10 mTorr, and the temperature of the heater was set at 450° C. at a temperature ascending rate of 10° C./min, while $N_2$ gas was flown from the purging tube at a rate of 100 sccm. The temperature distribution of a dummy wafer was observed at 450° C. using a thermal video ("JTG-6100" manufactured by JEOL. Ltd) to obtain the maximum and minimum values of the temperature on the mounting face. The dummy wafer was an AlN dummy wafer having a diameter φ of 300 mm and thickness of 1.5 mm. As a result, it was proved that the maximum and minimum temperatures were within a range of ±1 percent with respect to 450° C. Further, the flatness of the heating face at room temperature was lower than 10 μm. The warping of the heating face was measured by a laser displacement gauge after the temperature was elevated from room temperature to 450° C., and is proved to be also lower than 10 μm.

Further, arc discharge due to high vacuum was not observed in the inner space 7 of the supporting member 6. After the heating test was completed, corrosion was not observed in the molybdenum terminal whose corrosion resistant property was improved by nitrogen gas purge. Cracks and looseness were not observed in the parts fastened by screw of the supporting member 6, heat insulating plate 5 and substrate 1. The pressure in the inner space 7 of the supporting member could be maintained at a value lower than 1 Torr with O-rings.

Further, the following data of heat balance was obtained. That is, "T1" was 310° C., "T2" was 80° C. and "T3" was 25° C. when the temperature on the heating face was elevated to about 450° C.

Example 2

A heating system having a construction shown in FIGS. 3 to 5 was produced. The ceramic substrate 1 was made of an aluminum nitride sintered body, in which a molybdenum coil was embedded as the heat generator. Pins 2 for mounting wafer were formed of alumina. The thickness of the substrate 1 was 10 mm and the diameter φ was 320 mm. The heat insulating plate 5 was made of alumina, the thickness of the heat insulating plate 5 was 8 mm and the diameter φ was 80 mm. The tubular supporting member 6 was formed of aluminum alloy, the insulating tube 21 was formed of alumina, and the rod 13 for power supply was formed of nickel. The cooling shaft 18 was formed of aluminum alloy. Nitrogen gas was flown from the tip end of the purging tube 12, while the cooling flange 19 was cooled with flowing water. The heat insulating plate 5, flange portion 6c, and substrate 1 were fastened with a bolt 20 made of Inconel. The elastic body 21 was composed of a coil spring made of SUS and a washer made of SUS.

Using the thus produced heating system, the pressure in the chamber was adjusted at 10 mTorr, and the temperature of the heater was set at 450° C. at a temperature ascending rate of 10° C./min, while $N_2$ gas was flown from the purging tube at a rate of 100 sccm. The temperature distribution of a dummy wafer was observed at 450° C. using a thermal video ("JTG-6100" manufactured by JEOL. Ltd) to obtain the maximum and minimum values of the temperature on the mounting face. The dummy wafer was an AlN dummy wafer having a diameter φ of 300 mm and thickness of 1.5 mm. As a result, it was proved that the maximum and minimum temperatures were within a range of ±1 percent with respect to 450° C. Further, the flatness of the heating face at room temperature was lower than 10 μm. The warping of the heating face was measured by a laser displacement gauge after the temperature was elevated from room temperature to 450° C., and is proved to be also lower than 10 μm.

The following values were obtained.

| | |
|---|---|
| L0 | 2 mm |
| L1: | 5 mm |
| α1 | $5 \times 10^{-6}$ |
| t1 | 450° C. |
| L2 | 3 mm |
| α2 | $9 \times 10^{-6}$ |
| t2 | 400° C. |
| L3 | 5 mm |
| α3 | $24 \times 10^{-6}$ |
| t3 | 350° C. |
| L4 | 14 mm |
| α4 | $13 \times 10^{-6}$ |
| t4 | 430° C. |
| (L1 × α1 × (t1 − 25)) + (L2 × α2 × (t2 − 25)) + (L3 × α3 × (t3 − 25)) | 0.060 mm |
| (L4 × α4 × (t4 − 25)) | 0.063 mm |

Further, arc discharge due to high vacuum was not observed in the inner space 7 of the supporting member 6. After the heating test was completed, corrosion was not observed in the molybdenum terminal whose corrosion resistant property was improved by nitrogen gas purge. Cracks and disengagement were not observed in the parts fastened by screw of the supporting member 6, heat insulating plate 5 and substrate 1. The pressure in the inner space 7 of the supporting member could be maintained at a value lower than 1 Torr with O-rings.

Further, the following data of heat balance was obtained. That is, "T1" was 450° C., "T2" was 400° C. and "T3" was 430° C. when the temperature on the heating face was elevated to about 450° C.

As described above, the present invention provides a heating system having a ceramic heater and a supporting member supporting the back face of the heater, so that the cost of the supporting member can be reduced, the design change of the heating system is made easier and excellent flatness and temperature distribution of the heating face on use can be maintained.

The present invention has been explained referring to the preferred embodiments. However, the present invention is not limited to the illustrated embodiments which are given by way of examples only, and may be carried out in various modes without departing from the scope of the invention.

The invention claimed is:

1. A heating system comprising:
   a ceramic substrate having a heating face and a back face;
   a heating means for generating heat from said heating face of said ceramic substrate;
   a metal supporting member supporting said back face of said ceramic substrate, said metal supporting member having an outwardly extending flange portion which extends in a direction parallel to said back face of said ceramic substrate; and
   a heat insulating plate provided between said back face of said ceramic substrate and at least said flange portion of said metal supporting member.

2. The heating system of claim 1, wherein said heating means comprises a heating resistance embedded in said ceramic substrate.

3. The heating system of claim 1, further comprising a fastener fastening said supporting member, said heat insulating plate and said ceramic substrate.

4. The heating system of claim 2, further comprising a fastener fastening said supporting member, said heat insulating plate and said ceramic substrate.

5. The heating system of claim 3, further comprising an elastic body for energizing said fastener.

6. The heating system of claim 4, further comprising an elastic body for energizing said fastener.

7. The heating system of claim 3, wherein said ceramic substrate, said heat insulating plate, said metal supporting member and said fastener satisfy the following formula:

$$(L1 \times \alpha1 \times (t1-25)) + (L2 \times \alpha2 \times (t2-25)) + (L3 \times \alpha3 \times (t3-25)) < (L4 \times \alpha4 \times (t4-25))$$

wherein "α1" represents the thermal expansion coefficient of the material of said ceramic substrate, "α2" represents the thermal expansion coefficient of the material of said heat insulating plate, "α3" represents the thermal expansion coefficient of the material of said metal supporting member, "α4" represents the thermal expansion coefficient of the material of said fastener, "t1" represents the temperature at a region of said ceramic substrate near said fastener, "t2" represents the temperature at a region of said heat insulating plate near said fastener, "t3" represents the temperature at a region of said metal supporting member near said fastener, "t4" represents the average temperature of said fastener, "L1" represents the length of said fastener inserted in said ceramic substrate, "L2" represents the length of said fastener inserted in said heat insulating plate, "L3" represents the length of said fastener inserted in said metal supporting member, and "L4" represents the length of said fastener subjected to fastening except a part applying a pressure on an elastic body for energizing said elastic body.

8. The heating system of claim 6, wherein said ceramic substrate, said heat insulating plate, said metal supporting member and said fastener satisfy the following formula:

$$(L1 \times \alpha1 \times (t1-25)) + (L2 \times \alpha2 \times (t2-25)) + (L3 \times \alpha3 \times (t3-25)) < (L4 \times \alpha4 \times (t4-25))$$

wherein "α1" represents the thermal expansion coefficient of the material of said ceramic substrate, "α2" represents the thermal expansion coefficient of the material of said heat insulating plate, "α3" represents the thermal expansion coefficient of the material of said metal supporting member, "α4" represents the thermal expansion coefficient of the material of said fastener, "t1" represents the temperature at a region of said ceramic substrate near said fastener, "t2" represents the temperature at a region of said heat insulating plate near said fastener, "t3" represents the temperature at a region of said metal supporting member near said fastener, "t4" represents the average temperature of said fastener, "L1" represents the length of said fastener inserted in said ceramic substrate, "L2" represents the length of said fastener inserted in said heat insulating plate, "L3" represents the length of said fastener inserted in said metal supporting member, and "L4" represents the length of said fastener subjected to fastening except a part applying a pressure on said elastic body for energizing said elastic body.

9. The heating system of claim 1, wherein an inner space is formed in said metal supporting and sealed in air tight manner.

10. The heating system of claim 4, wherein an inner space is formed in said metal supporting and sealed in air tight manner.

11. The heating system of claim 8, wherein an inner space is formed in said metal supporting and sealed in air tight manner.

12. The heating system of claim 1, further comprising a power supply member provided in an inner space formed in said metal supporting member and an insulating means surrounding said power supply member for insulation.

13. The heating system of claim 4, further comprising a power supply member provided in an inner space formed in said metal supporting member and an insulating means surrounding said power supply member for insulation.

14. The heating system of claim 10, further comprising a power supply member provided in an inner space formed in said metal supporting member and an insulating means surrounding said power supply member for insulation.

15. The heating system of claim 11, further comprising a power supply member provided in an inner space formed in said metal supporting member and an insulating means surrounding said power supply member for insulation.

* * * * *